United States Patent
Arias et al.

(10) Patent No.: US 12,135,303 B2
(45) Date of Patent: Nov. 5, 2024

(54) SENSOR HAVING TUBULAR WALLED SENSING CAVITY

(71) Applicant: TEXAS INSTRUMENTS INCORPORATED, Dallas, TX (US)

(72) Inventors: Christlyn Faith Arias, Mabalacat (PH); Jeffrey Solas, Iloilo (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 120 days.

(21) Appl. No.: 18/159,244

(22) Filed: Jan. 25, 2023

(65) Prior Publication Data

US 2024/0248058 A1 Jul. 25, 2024

(51) Int. Cl.
| | |
|---|---|
| *G01N 27/22* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 23/495* | (2006.01) |

(52) U.S. Cl.
CPC ....... *G01N 27/223* (2013.01); *H01L 21/4825* (2013.01); *H01L 21/565* (2013.01); *H01L 23/3157* (2013.01); *H01L 23/4952* (2013.01); *H01L 23/562* (2013.01); *H01L 23/564* (2013.01)

(58) Field of Classification Search
CPC ... G01R 27/2605; G06F 3/0428; G06F 3/044; G06F 3/0441; G06F 3/0442; G06F 3/0443; G06F 3/0444; G06F 3/0445; G06F 3/0446; G06F 3/0447; G06F 3/0448

See application file for complete search history.

(56) References Cited

U.S. PATENT DOCUMENTS

| | | | |
|---|---|---|---|
| 2013/0081464 A1* | 4/2013 | Park | G01C 19/5783 73/504.12 |
| 2015/0107359 A1* | 4/2015 | Yang | G01P 15/123 73/514.33 |

* cited by examiner

*Primary Examiner* — Tung X Nguyen
(74) *Attorney, Agent, or Firm* — Ronald O. Neerings; Frank D. Cimino

(57) ABSTRACT

A semiconductor device includes a semiconductor die having a surface and sensing circuitry at a sensing region of the surface. A tubular wall of a metal material has an inner sidewall around the sensing region to provide a sensing cavity that extends from the surface of the semiconductor die to an opening at a distal edge thereof. The tubular wall includes a proximal portion and a distal flange portion. The proximal portion extends longitudinally from the surface. The distal flange portion extends radially outwardly from the proximal portion a first distance and radially inwardly from the proximal portion a second distance that is less than the first distance.

22 Claims, 11 Drawing Sheets

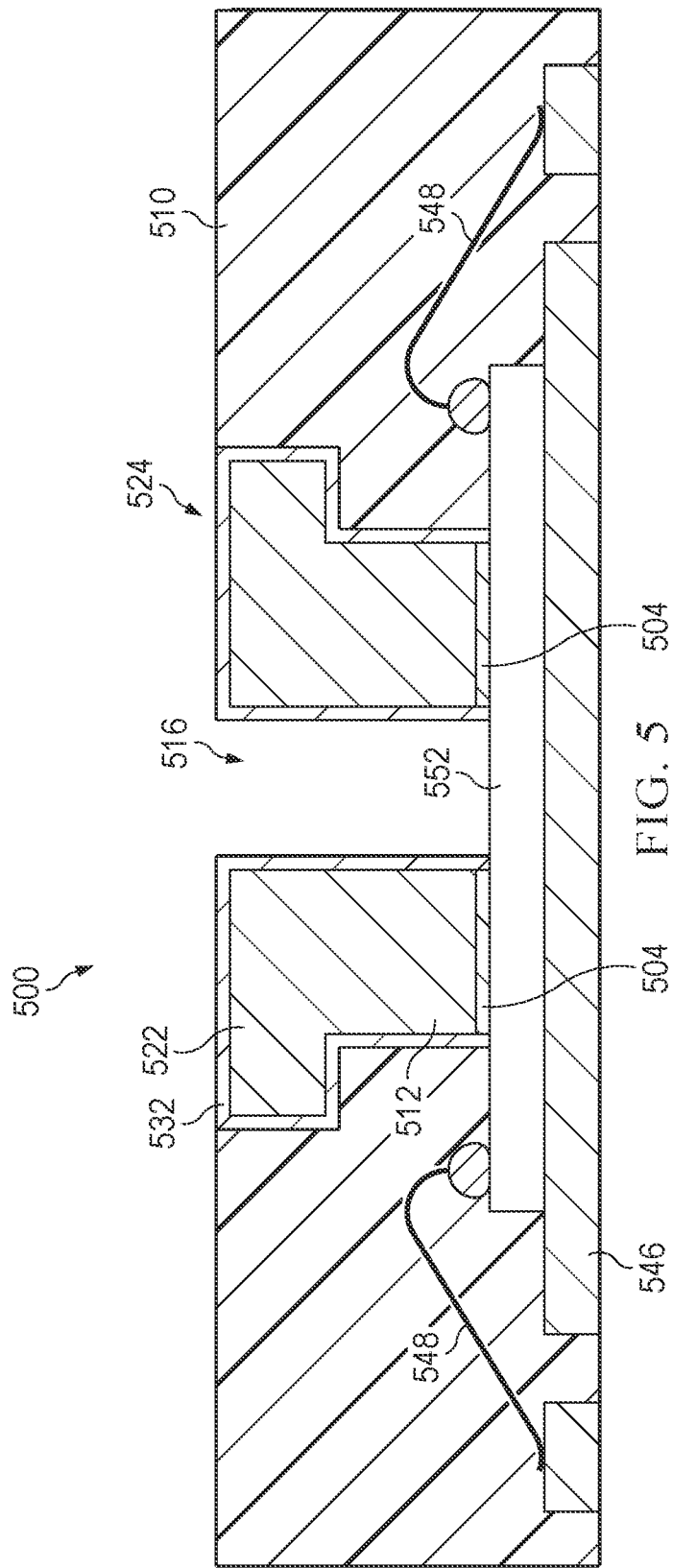

SENSOR HAVING TUBULAR WALLED SENSING CAVITY

TECHNICAL FIELD

This description relates generally to humidity sensors, and more particularly to a sensor having a tubular walled sensing cavity.

BACKGROUND

A capacitive hygrometric sensor can measure the effect of humidity on the dielectric constant of a polymer or metal oxide material. Capacitive hygrometric sensors have the benefits of being relatively small in size and relatively robust against effects such as condensation and temporary high temperatures, but are subject to contamination, drift, and aging effects. In such sensors, measurement circuitry can be used to measure capacitance indirectly, such as by using the capacitance to control the frequency of an oscillator, or to vary the level of coupling (or attenuation) of an AC signal.

SUMMARY

An example semiconductor device includes a semiconductor device includes a semiconductor die having a surface and sensing circuitry at a sensing region of the surface. A tubular wall of a metal material has an inner sidewall around the sensing region to provide a sensing cavity that extends from the surface of the semiconductor die to an opening at a distal edge thereof. The tubular wall includes a proximal portion and a distal flange portion. The proximal portion extends longitudinally from the surface. The distal flange portion extends radially outwardly from the proximal portion a first distance and radially inwardly from the proximal portion a second distance that is less than the first distance.

An example method of making a semiconductor device includes forming a seed layer over a surface of a semiconductor die and forming a first annular trough patterned in a first photoresist layer on the seed layer. The method also includes forming a proximal portion of a tubular wall of a metal material in the first annular trough. The method also includes forming a second annular trough patterned in a second photoresist layer over the first photoresist layer and the proximal portion of the tubular wall. The method also includes forming a distal flange portion of the tubular wall of the metal material in the second annular trough, in which the tubular wall has a radially inner sidewall around a sensing region on the surface of the semiconductor die and the distal flange portion extends radially outwardly from the proximal portion over the surface of the semiconductor die.

An example packaged semiconductor device includes a lead frame having a die pad and a semiconductor die on the die pad. The semiconductor die includes a humidity sensor that includes sensing circuitry at a sensing region of a surface of the semiconductor die. A metal tubular wall has a central sensing cavity extending through an inner sidewall thereof overlying the sensing region. The tubular wall has a proximal portion and a distal flange portion, in which the proximal portion extends longitudinally from the surface of the semiconductor die, and the distal flange portion extends radially outwardly from the proximal portion a first distance and radially inwardly from the proximal portion a second distance that is less than the first distance. A molding material encapsulates a portion of the lead frame and a portion of the semiconductor die along a radially outer surface of the tubular wall, in which the sensing cavity and sensing region are free of the molding material.

BRIEF DESCRIPTION OF THE DRAWINGS

FIG. 5 is a cross-sectional diagram showing an example molded humidity sensor mounted to a lead frame and having a protectively coated L-shaped tubular wall made according to the method of FIGS. 1A-1I.

DETAILED DESCRIPTION

Figure 1A:
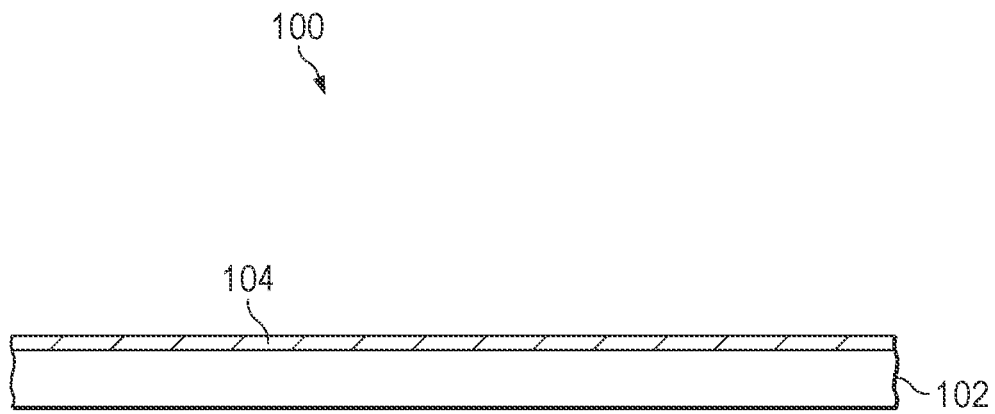
FIGS. 1A-1F are cross-sectional layer diagrams showing an example method of forming a tubular wall for a sensor.

Miniaturization of sensors has resulted in decreased sensor cavity opening sizes to where challenges are imposed in the manufacturability of certain structure, such as tubular walls having a mushroom overplate structure, which line sensor cavities. Such challenges can include resist residue forming at the cavity opening and inability to control the wall inner diameter since there are no existing process regulations to control overplating.

For example, a sensor (e.g., a humidity sensor) can include an open sensing cavity exposed to the environment. The cavity can be defined, for example, by a tubular wall open at a top end. An exposed area of a substrate within the sensing cavity, at the bottom end of the tubular wall, can have a sensing polymer configured to change its permittivity when exposed to moisture, in turn changing the capacitance of electrodes underneath the sensing polymer. The change in capacitance can be sensed by sensing circuitry and translated into relative humidity. The electrodes and sensing polymer can be fabricated, for example, on a semiconductor (e.g., silicon) substrate which is subsequently packaged by coupling it to a lead frame and encapsulating the substrate and the lead frame with molding material. During the packaging process, the tubular wall prevents the molding material from coating the sensing polymer by blocking the flow of molding material. The tubular wall is of sufficient height (depth) such that the molding material covers wire bonds in the package, which extend vertically up from the lead frame in arcs. The tubular wall has a distal flange portion (e.g., an outer overhang or protruding rim portion) extending radially outwardly from the tubular wall. The flange portion is configured to promote adhesion of the molding material to the tubular wall and inhibit delamination of the molding material from the tubular wall.

In some examples, it is desirable to reduce the size of the humidity sensor as much as possible, including by narrowing the diameter of the tubular wall. However, with existing tubular wall designs and fabrication methods, reductions in tubular wall diameter can introduce fabrication defects that can limit how much the tubular wall diameter can be narrowed without reducing sensor fabrication yield. For example, the tubular wall overhang extends both outwardly and radially inwardly into the sensing cavity with the tubular wall, which can block the escape of resist residue from the cavity opening during fabrication. Particles of resist residue can thereby occlude the cavity opening, resulting in a nonfunctional humidity sensor or one having reduced accuracy. The fabrication methods and semiconductor devices described herein preserve the outside overhang of a distal flange portion of the tubular wall while reducing or eliminating the interior overhang. The fabrication methods and semiconductor devices described herein can also be implemented to maintain the tubular wall height, thus accommodating tall wire-bond loops, promoting mold adhesion to the tubular wall, and reducing manufacturing defects even for small-diameter humidity sensor tubular walls (e.g., having an outer diameter of 340 µm or less and an inner diameter of 140 µm or less).

Figure 1B:
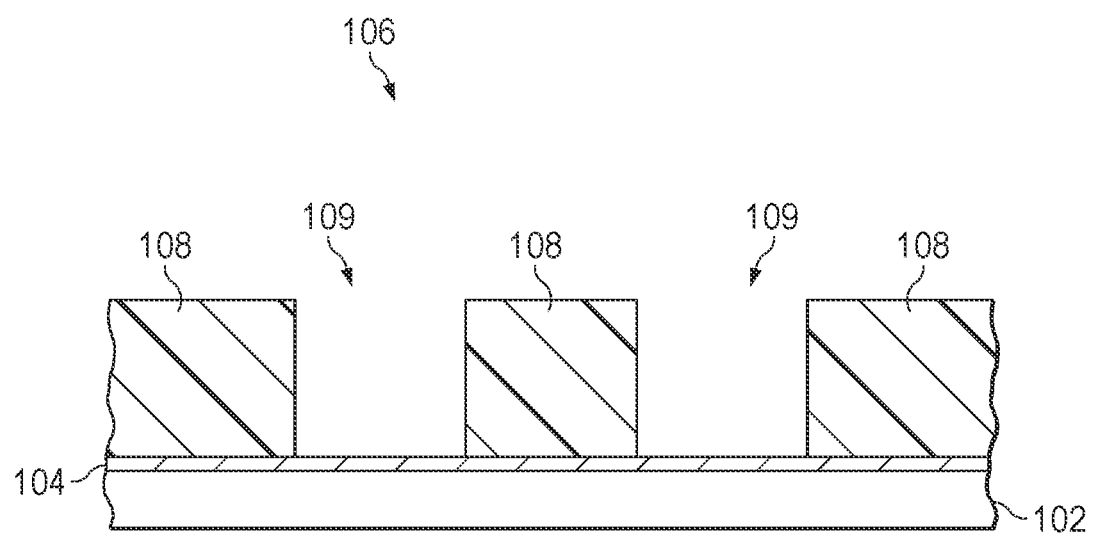
Figure 1C:
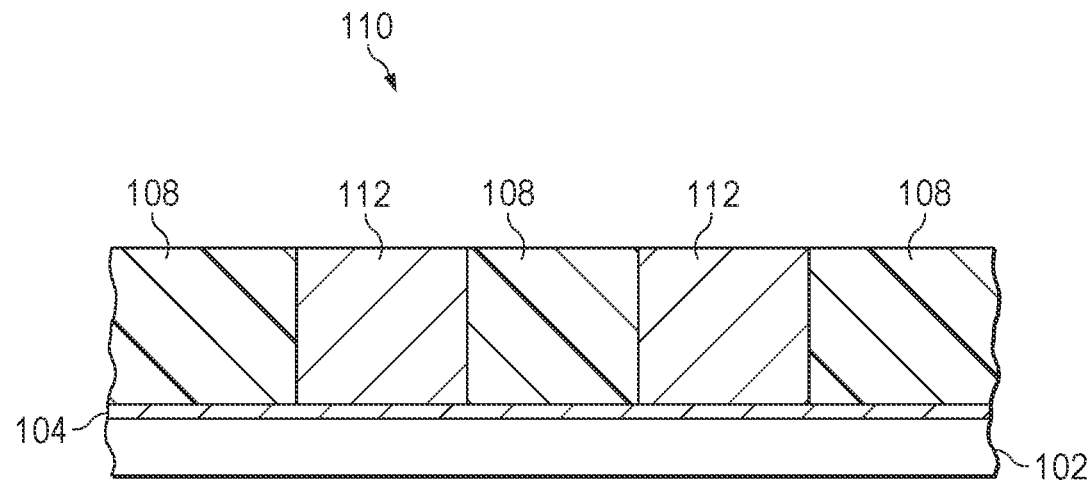
Figure 1D:
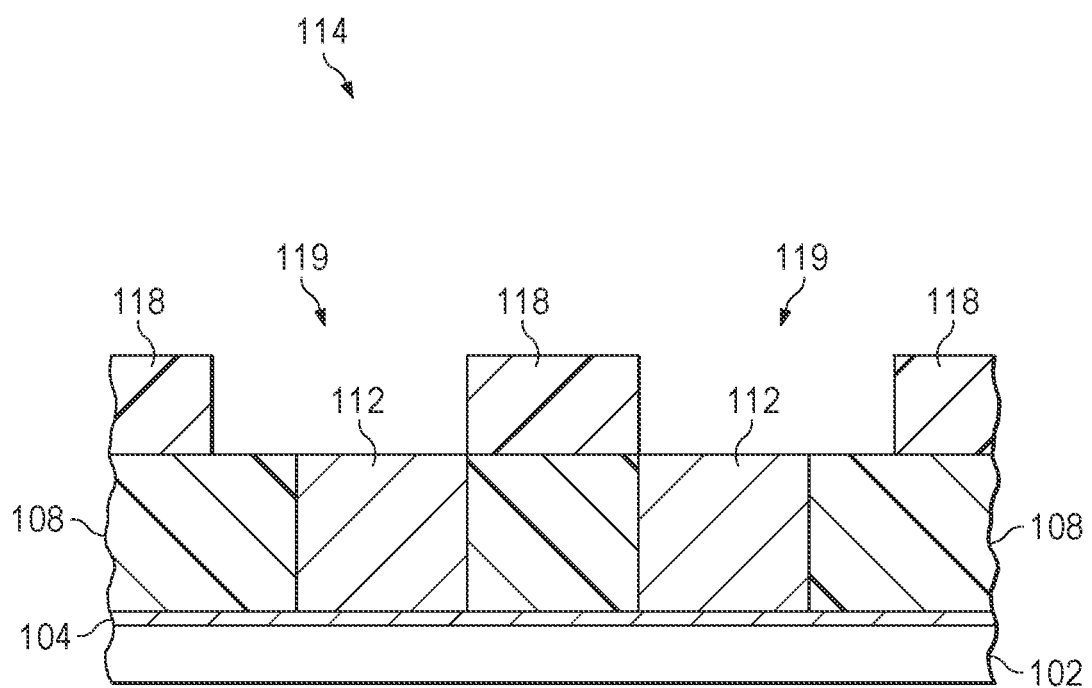
Figure 1E:
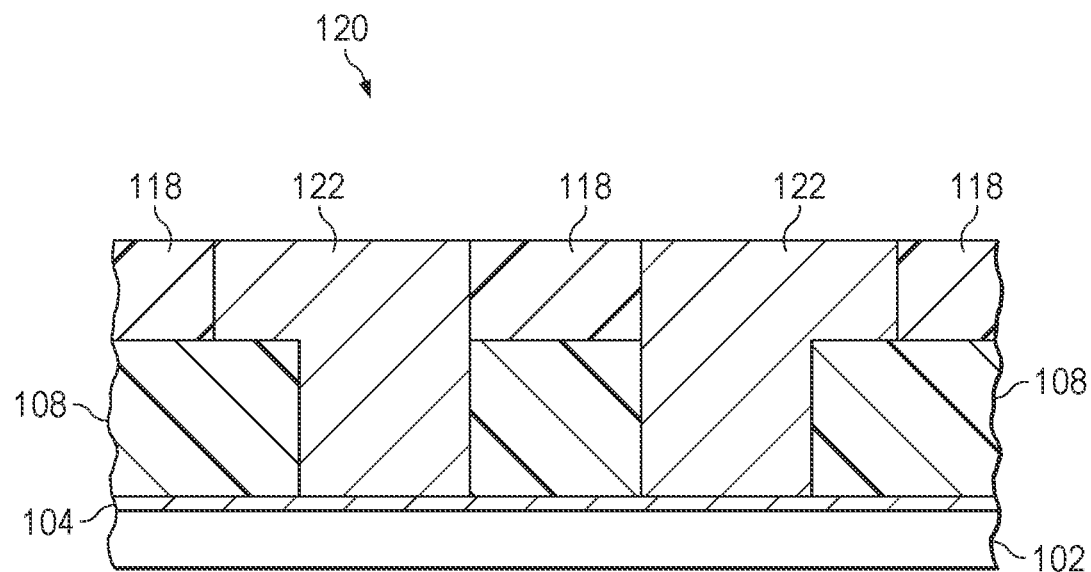
Figure 1F:
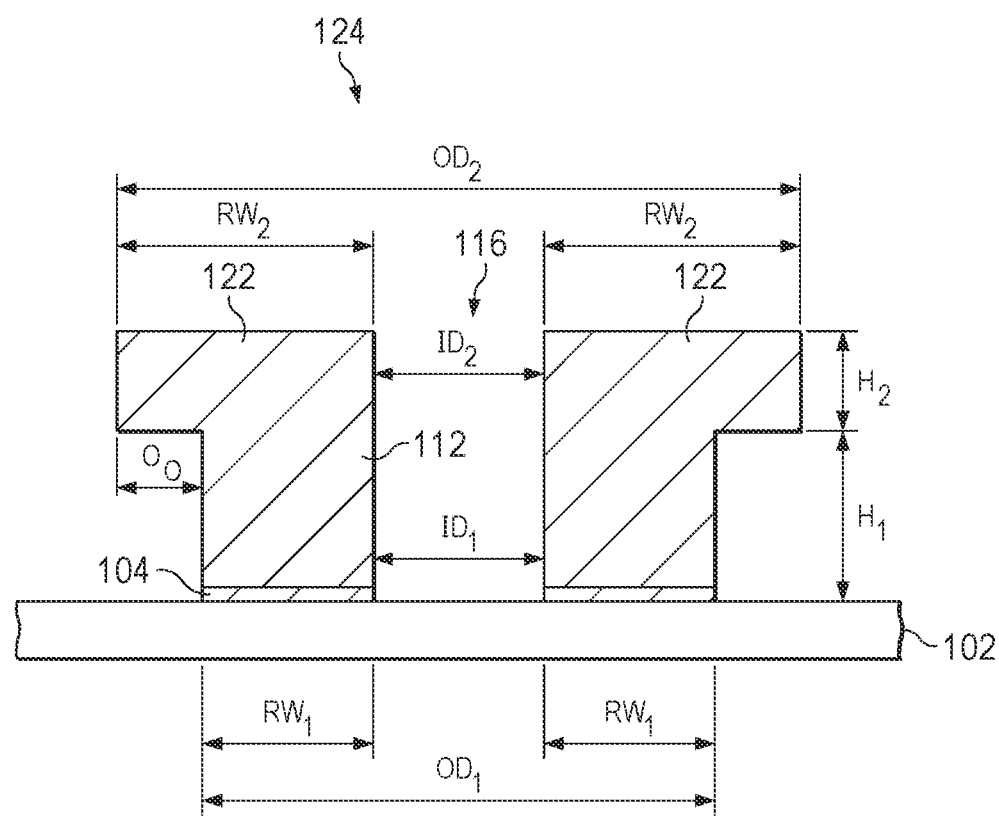

FIGS. 1A through 1F are cross-sectional layer diagrams showing an example method of forming a tubular wall (metal annulus), such as for a humidity sensor implemented in a substrate 102 on which the tubular wall is formed. As shown in the example of FIG. 1F, the tubular wall 124 has an L-shaped cross-section include a proximal portion 112 and a distal flange portion (e.g., rim) 122. The distal flange portion 122 thus includes an overhang that extends radially outwardly from the proximal portion 112 a distance, shown at $O_O$. The tubular wall 124 can have a substantially constant inner diameter, such that the distal flange portion 122 has no radially inwardly extending portion over the sensor cavity opening. Alternatively, there the flange portion 122 can radially inwardly extend from the proximal portion a distance that is less than the overhang distance $O_O$. As described herein, the absence of an inner overhang along the tubular wall 124 (shown in FIG. 1F) advantageously enables the sensor structure to reduce or eliminate trapping residue and/or particles during fabrication.

FIG. 1A shows an initial structure 100 including a semiconductor (e.g., silicon) substrate 102, which has been fabricated to include a sensor (not shown), such as including a humidity sensor circuit formed on a die. For example, the humidity sensor includes a capacitor structure having an arrangement of spaced apart capacitor plates (e.g., electrodes) within an insulating material (e.g., silicon) of the substrate 102. The substrate 102 also includes a layer of sensing polymer formed over the capacitor structure, such as over a passive layer. The sensing polymer is thus arranged in the substrate 102 at an area to be exposed within a sensing cavity of the resulting sensor. The sensing polymer can be a dielectric polymer material configured to absorb when exposed to moisture and desorb water when heated. The sensing polymer thus has a dielectric constant that varies depending on the amount of moisture absorbed or desorbed, which adjusts the capacitance of the capacitor structure. The sensor can also include circuitry configured to sense temperature.

As shown in FIG. 1A, a metal seed layer 104 is formed on the substrate 102. For example, the metal seed layer 104 can be deposited on the substrate 102, such as a sputter deposition of titanium-tungsten and copper. The seed layer can also be formed using other deposition techniques.

FIG. 1B shows an intermediate structure 106 showing a first photoresist material 108 formed over the metal seed layer 104. In the structure 106 shown in FIG. 1B, the photoresist material 108 is shown following coating, exposure, and developing of a layer of a first photoresist material 108. For example, the first photoresist material 108 can be formed to a thickness of between about 50 µm and about 150 µm (e.g., about 90 µm), which can depend on the desired size of the sensing cavity around the humidity sensor. The first photoresist material 108 applied over the substrate 102 and seed layer 104 of view 100 can be either a negative resist or a positive resist. After applying the first photoresist material 108, a first mask (not shown in FIG. 1B) is applied to the first photoresist material 108. Light passes through any transparent portion of the first mask and exposes the first photoresist material 108. The first photoresist material 108 is then developed to form a respective annular (e.g., ring-shaped) opening 109 in the first photoresist material 108. A single first annular opening 109 appears in the cross-sectional view of FIG. 1B as two wells, both of which represent regions of the same annular opening 109. In other examples, the opening 109 could be formed to have different shapes according to the desired cross-sectional shape of the tubular wall around the sensor cavity.

Figure 2:
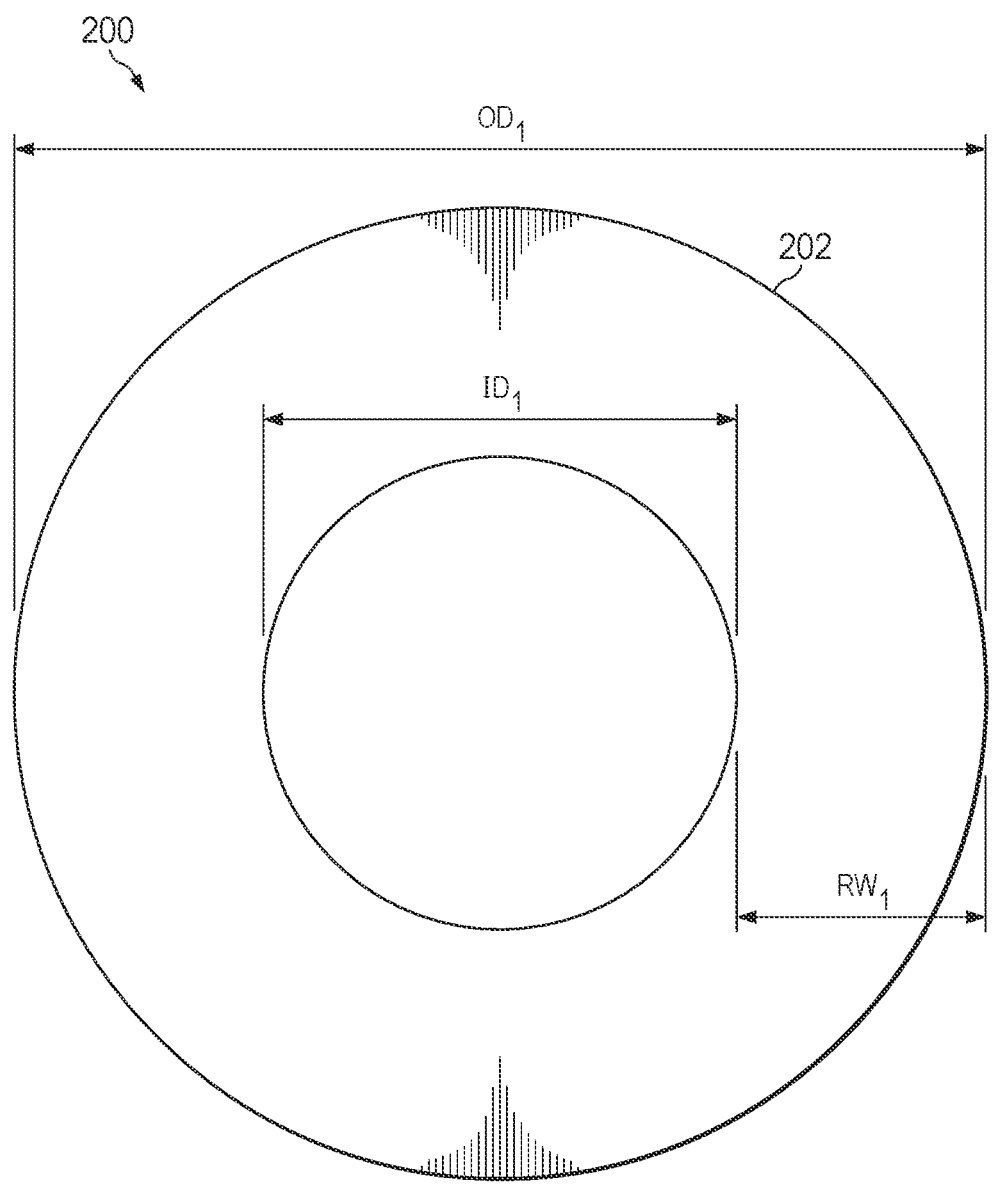
FIG. 2 is a diagram of an example mask for forming a tubular wall for a humidity sensor.

FIG. 2 shows, in top-down view, an example mask 200 configured to form a tubular wall for a humidity sensor having a defined wall offset. The mask portion 202 can represent either a transparent portion of the mask 200 or an absorbing portion of the mask 200 depending on whether the photoresist material 108 is a positive resist or a negative resist. In an example, the mask 200 has a first ring width $RW_1$ of 100 µm, a first inner diameter $ID_1$ of 190 µm, and a first outer diameter $OD_1$ of 390 µm. Other example masks may have other dimensions. The inner diameter defines the size of the opening for the exposed sensing cavity, as described herein.

Figure 3:
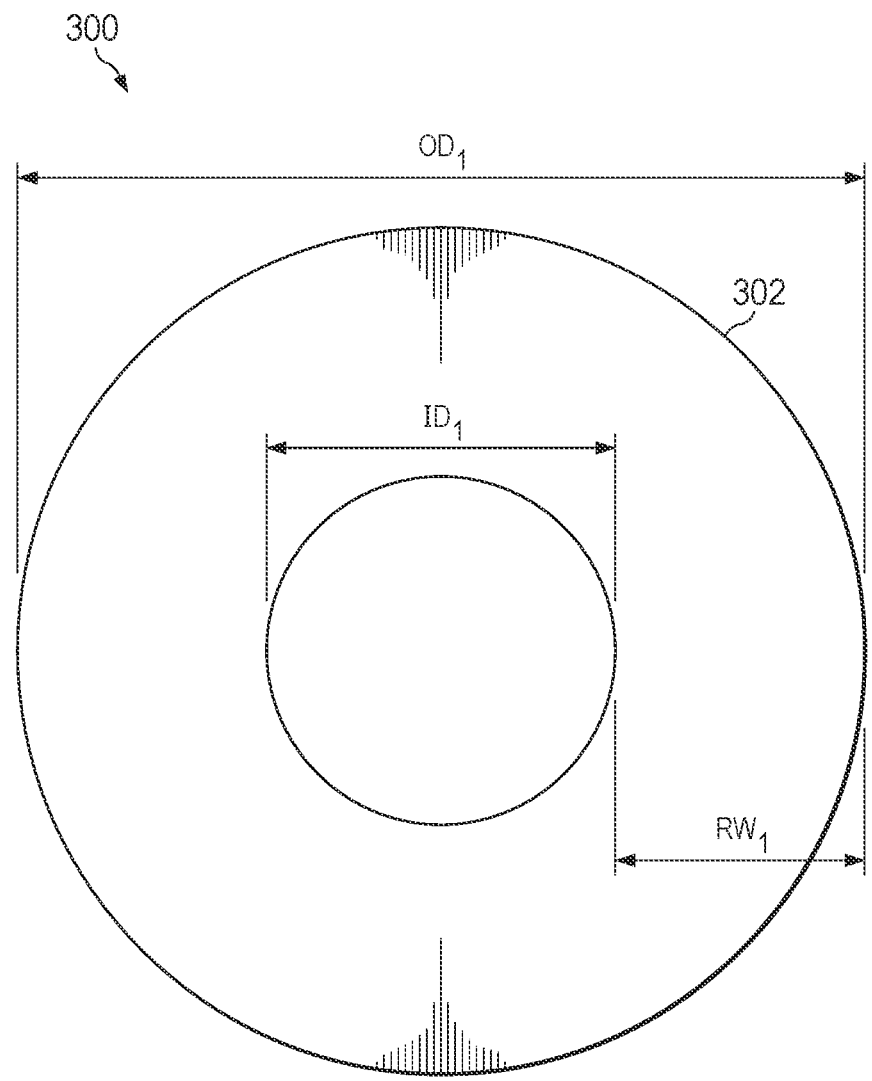
FIG. 3 is a diagram of an example mask for forming a tubular wall for a humidity sensor.

FIG. 3 shows, in top-down view, another example mask 300 configured to form a tubular wall for a humidity sensor having a smaller wall offset than the example of FIG. 2. The mask portion 302 can represent either a transparent portion of the mask 300 or an absorbing portion of the mask 300 depending on whether the photoresist material 108 is a positive resist or a negative resist. In an example, the mask 300 has a first ring width $RW_1$ of 100 µm, a first inner diameter $ID_1$ of 140 µm, and a first outer diameter $OD_1$ of 340 µm. Other example masks may have other dimensions.

FIGS. 2 and 3 depict examples of masks that can be used create tubular walls that are circular in shape, but tubular walls can have other cross-sectional shapes, such as ellipsoid, oval, square, rectangular, star, triangular, pentagonal, hexagonal, or others. As used herein, the terms "ring" and "annulus" encompass any completely enclosed unfilled shape. For tubular wall shapes other than circular, the "diameter" of such shapes can refer to the diameter of the largest circle inscribable completely within the shape.

FIG. 1C shows another intermediate structure 110 in which a proximal portion 112 of a tubular wall is being formed of a metal material. For example, the proximal portion 112 can be formed in the annular opening 109 (FIG. 1B) by depositing the metal material. In an example, the proximal portion 112 of the tubular wall can be electroplated from the metal seed layer 104. For example, the proximal portion 112 of the tubular wall is a copper or nickel material. As shown in the example of FIG. 1C, the proximal portion 112 of the tubular wall is not overplated substantially beyond the surface of the first photoresist material 108, and thus does not develop a mushroom-cap-shaped rim with overhangs, as exists in some tubular wall designs.

FIG. 1D shows a next intermediate structure 114 showing a second patterned photoresist material 118 formed over the structure 110 shown in FIG. 1C. For example, the second photoresist material 118 is coated, exposed, and developed over the first photoresist material 108 to produce the patterned resist having a second annular opening 119 shown in FIG. 1D. The application of the second photoresist material 118 can use the same type (positive or negative) resist as the first photoresist material 108 or it can be the opposite type. For example, the first photoresist material 108 can be a negative resist and the second photoresist material 118 can be a positive resist. The mask designs can be adjusted accordingly to provide the desired configuration for patterned photoresist materials 108, 118. For example, if the first photoresist material 108 is a negative resist and the second photoresist material 118 is a positive resist, the first mask can be transparent over the regions of the first photoresist material 108 that are intended to remain after developing, and the second mask can be transparent over the regions of the second photoresist material 118 that are intended to be removed with developing. Making the first photoresist material 108 a negative resist and the second photoresist material 118 a positive resist has a first advantage that the development of the second photoresist material 118 will not remove portions of the first photoresist material 108 intended to remain after the development of the second photoresist material 118, and thus the distal flange portion 122 of the tubular wall will not take on an unintended shape. If both the first photoresist material 108 and the second photoresist material 118 are positive resists, the exposure energy used for exposing the second photoresist material 118 can be finely controlled so as to expose only the amount of thickness of the second photoresist material 118 desired to be removed, and not any of the first photoresist material 108. The patterning of the second photoresist material 118 can use a second mask similar in shape to the first mask. For example, the second mask has a second inner diameter $ID_2$ that is approximately equal to the first inner diameter $ID_1$ of the first mask, and has a second outer diameter $OD_2$ larger than the first outer diameter $OD_1$ of the first mask.

FIG. 1E shows another intermediate structure 120 in which the distal flange portion 122 of the tubular wall is formed of a metal material. The distal flange portion 122 can be formed in the second annular opening 119 (FIG. 1D) by depositing the metal material. For example, the distal flange portion 122 of the tubular wall is electroplated over the proximal portion 112. Such second electroplating forms the distal flange portion 122 of the tubular wall, in which part of the distal flange portion extends the length of the proximal portion axially away from the substrate 102 and another part of the distal flange portion extends radially outwardly from the center of the tubular wall. As a result, the tubular wall has the appearance of an inverted L-shape in cross-section, in which the distal flange portion 122 of the tubular wall forms a rim having a substantial outer overhang $O_O$ and in insubstantial or nonexistent inner overhang. The distal flange portion 122 of the tubular wall can be formed of the same metal as the proximal portion 112 (e.g., copper or nickel). Making the first photoresist material 108 a negative resist and the second photoresist material 118 a positive resist has a second advantage, namely, that the distal flange portion 122 of the tubular wall can be made thinner (in the height and/or depth dimension) and more stable.

FIG. 1F illustrates an example tubular wall 124 formed over the substrate 102. The tubular wall 124 thus includes proximal portion 112 and distal flange portion 122. The tubular wall 124 can be formed following strip and etch processes to remove the first and second photoresist materials 108, 118 and the remainder of the seed layer 104. As a consequence of the two-step plating process, the distal flange portion 122 of the tubular wall 124 has some amount of outer overhang $O_O$ and an insubstantial or nonexistent inner overhang. The proximal portion 112 of the tubular wall 124 has a first outer diameter $OD_1$, a first inner diameter $ID_1$, a first ring width $RW_1$, and a first height $H_1$. The first inner diameter $ID_1$, which is measured along a direction parallel to the substrate surface, exposes an area of the sensing polymer implemented at the surface of the substrate 102. The first height $H_1$, which is measured along a direction orthogonal to a surface of the substrate, is about equal to the thickness of the coating of the removed first photoresist material 108. The distal flange portion 122 of the tubular wall has a second outer diameter $OD_2$, a second inner diameter $ID_2$ that is about equal to the first inner diameter $ID_1$, a second ring width $RW_2$, and a second height $H_2$. The second height $H_2$ is about equal to the thickness of the coating of the removed second photoresist material 118. Thus, the first height $H_1$ and the second height $H_2$ can be design parameters that are controlled according to the thickness of first photoresist material 108 and 118. The second inner diameter $ID_2$ provides a cavity opening 116 that can be wider than a cavity opening produced by a typical overplating method. Accordingly, the L-shaped tubular wall of the two-step plating method of FIGS. 1A through 1F is less susceptible to the trapping of resist residue in the cavity than existing tubular wall configurations.

The outer overhang $O_O$ of the tubular wall is configured to provide a mold locking feature during encapsulation. In an example, the outer overhang $O_O$ of the tubular wall extends radially outwardly a distance less that the total height (e.g., axial length) of the tubular wall 124. In some examples, the outer overhang $O_O$ of the tubular wall (annulus) is at least five percent of the height $(H_1+H_2)$ of the tubular wall. In some examples, the outer overhang $O_O$ is at least ten percent of the height of the tubular wall. In some examples, the outer overhang $O_O$ is at least fifteen percent of the height of the tubular wall. In some examples, the outer overhang $O_O$ is at least twenty percent of the height of the tubular wall.

The height $(H_1+H_2)$ of the tubular wall 124 can be determined based on the height of a bond wire loop used to electrically couple the substrate 102 with a lead frame (see, e.g., FIGS. 4 and 5), and is configured to a height to avoid having exposed bond wires in the packaged device. The height $H_2$ of the distal flange portion 122 for a given device thus can be configured based on the height $H_1$ and the height of bond wire loop. In an example, the height $H_1=90$ μm and the height $H_2$ of the distal flange portion 122 is approximately 50 μm to approximately 60 μm to provide a sufficient thickness to encapsulate bond wires. In some examples, the height $H_2$ of the distal flange portion 122 is less than twenty-five percent of the total height $(H_1+H_2)$ of the tubular wall. In some examples, the height $H_2$ of the distal flange portion 122 is less than twenty percent of the height $(H_1+H_2)$ of the tubular wall. In some examples, the height $H_2$ of the distal flange portion 122 is less than fifteen percent of the height $(H_1+H_2)$ of the tubular wall. In some examples, the height $H_2$ of the distal flange portion 122 is less than ten percent of the height $(H_1+H_2)$ of the tubular wall. In some examples, the height $H_2$ of the distal flange portion 122 is less than five percent of the height $(H_1+H_2)$ of the tubular wall. Other heights can be used in other examples, which can vary depending on application requirements and desired package sizes.

As described herein, the L-shaped tubular wall enables a smaller inner diameter and smaller dies to be used for implementing a packaged moisture sensor compared to many existing approaches. In some examples, the interior of the tubular wall 124 has an interior diameter $ID_1$ of less than about 75 micrometers as measured at the bottom of the annulus. In other examples, the interior of the annulus has an interior diameter $ID_1$ of less than about 50 micrometers as measured near the substrate 102 near the bottom of the annulus. Other inner diameters can be used for implementing a moisture sensor.

In some examples, the inner wall is orthogonal to the surface of the substrate 102, such that $ID_1=ID_2$. In other examples, the inner wall may be formed to extend at an angle (e.g., an acute or obtuse angle) relative to the surface of the substrate 102, such that $ID_1 \neq ID_2$. In some examples, the first inner diameter $ID_1$ and the second inner diameter $ID_2$ are each less than about 150 micrometers, and the second outer diameter $OD_2$ is greater than about 400 micrometers. In some examples, the first inner diameter $ID_1$ and the second inner diameter $ID_2$ are each less than about 140 micrometers, and the second outer diameter $OD_2$ is greater than about 420 micrometers. Other values of inner and outer diameters can be used in other examples, which can vary depending on application requirements and desired package sizes.

Figure 1G:
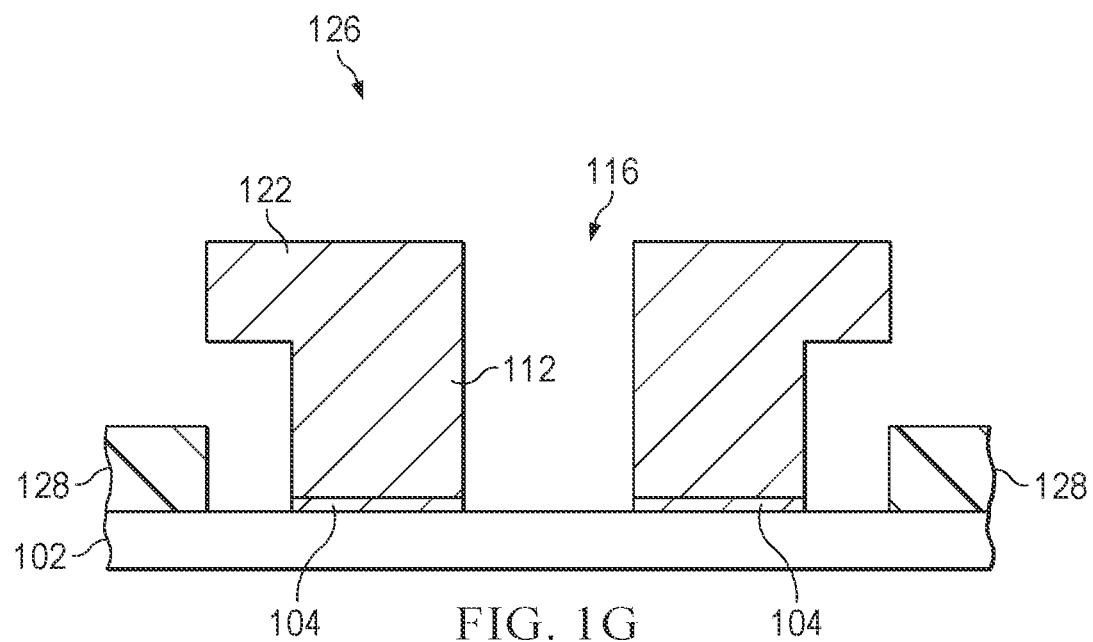
FIGS. 1G-1I are cross-sectional layer diagrams showing an example method of forming a protectively plated tubular wall for a sensor that continues from the method shown in FIGS. 1A-1F.
Figure 1H:
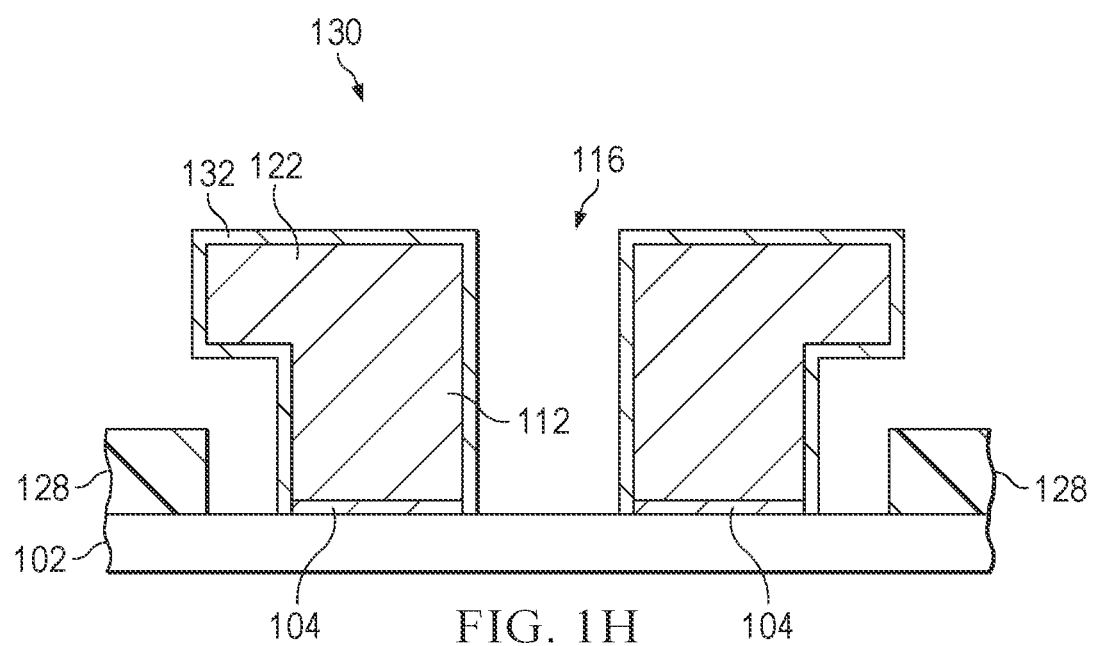
Figure 1I:
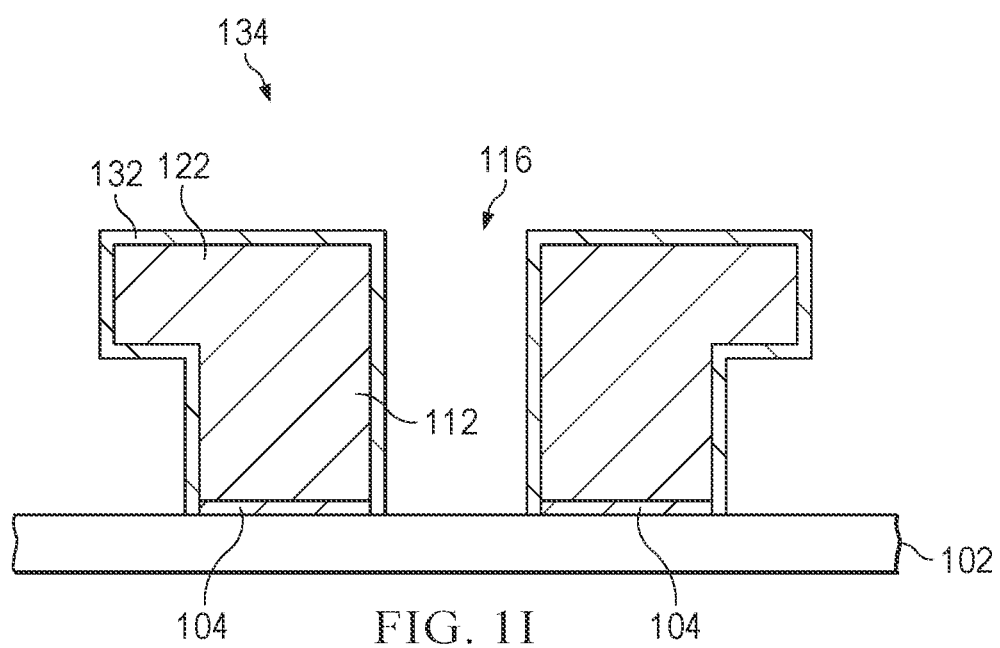

FIGS. 1G through 1I show addition parts of an example method of forming a plated tubular wall for a humidity sensor. FIG. 1G continues from the tubular wall structure 124 provided according to the method shown in FIGS. 1A through 1F. Copper is reactive to the environment and oxidizes with moisture. When copper is used as the metal for the tubular wall 124, oxidation over time can affect the performance of the humidity sensor. Accordingly, the example method of FIGS. 1A through 1I can be used to create an L-shaped tubular wall that has a surface protection coating (e.g., one or more layers of electroless nickel or electroless tin) to protect the copper from oxidation.

FIG. 1G shows an intermediate structure 126 being made, in which a third patterned photoresist material 128 is formed over the substrate 102. For example, the third photoresist material 128 can coated, exposed, and developed over the substrate 102. After being developed, the third photoresist material 128 remains over at least the portion of surface of the semiconductor substrate 102, such as a portion having one or more wire bond pads (not shown), and leaves uncoated the tubular wall. The wire bond pads may be aluminum or copper, for example, and are coated with the third photoresist material 128 to prevent the wire bond pads from being subsequently plated with the protective coating intended for the exposed (e.g., inner and outer) surfaces of the metal tubular wall 124.

FIG. 1H shows a cross-sectional view 130 of the tubular wall 124 coated with a protective layer (e.g., corrosion-resistant coating) 132. For example, the protective layer 132 can be formed by electroplating of a protective material over the tubular wall 124, such as an electroless nickel or electroless tin. FIG. 1I is cross-sectional view 134 that shows the resulting coated tubular wall 124 following a strip process to remove the third photoresist material 128.

Whether the L-shaped tubular wall is left uncoated (as in FIGS. 1A through 1F) or is protectively coated, e.g., with electroless nickel or electroless tin (as in FIGS. 1A through 1I), the humidity sensor, including the L-shaped ring, wall can be packaged in a process that includes mounting the silicon substrate to a lead frame and encapsulating the sensor and lead frame with a molding material. The lead frame can be a metal lead frame (e.g., copper) and can have wire-bond connections that are also encapsulated by the molding material to form a packaged sensor device.

Figure 4:
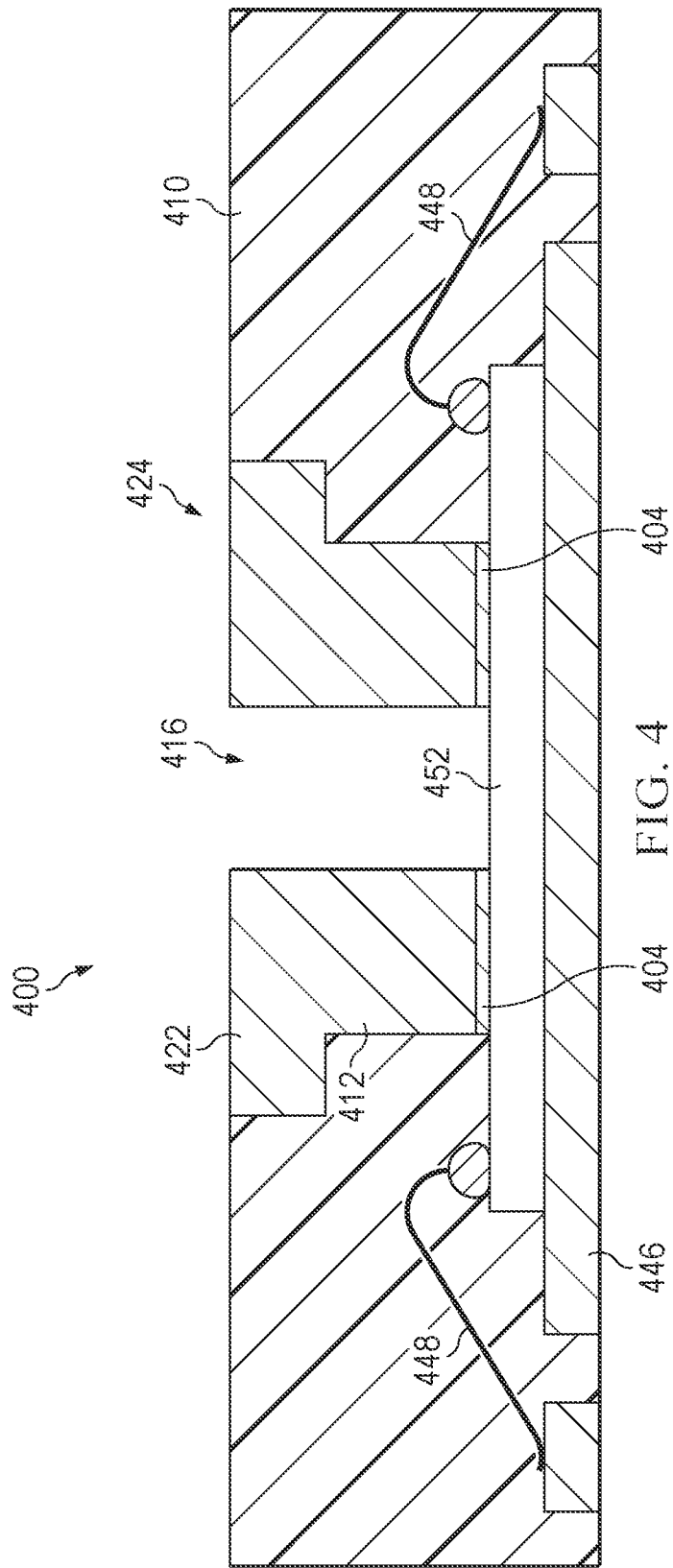
FIG. 4 is a cross-sectional diagram showing an example molded humidity sensor mounted to a lead frame and having an L-shaped tubular wall made according to the method of FIGS. 1A-1F.

FIG. 4 shows an example of a packaged sensor 400 mounted to a lead frame 446 and including an L-shaped tubular wall 424 formed over a seed layer 404. The tubular wall 424 can be made according to the method of FIGS. 1A through 1F (or through FIG. 1I). The tubular wall 424 thus has a proximal portion 412 and a distal flange portion 422, such as described herein, in which the distal flange portion 422 extends a first distance radially outwardly from the proximal portion 412 and extends a second distance (e.g., smaller than the first distance or zero) radially inwardly from the proximal portion. For example, the inner sidewall portion of the tubular wall 424 can have a constant inner diameter or the inner sidewall of the tubular wall can be tapering between proximal and distal ends, but excluding a radially inwardly extending overhang. Molding material 450 can be applied to encapsulate the device using a mold configured to apply the molding material around the device while also preventing molding material from entering the sensing cavity. The molding material can be a plastic or epoxy material. During encapsulation, the outer overhang of the distal end portion 422 of the tubular wall 424 is further configured to function as a stop (e.g., a flange) to reduce or prevent sideward inflow of the molding material 450 from entering an opening of the sensing cavity 416 and coating the polymer and capacitive sensor elements (not shown) exposed at a sensing area 452 of the surface of the semiconductor (e.g., silicon) substrate 404. The outer overhang of the distal flange portion 422 of the tubular wall also is configured to promote adhesion and help prevent delamination of the molding material 450 from the tubular wall 424. As described herein, the tubular wall can be metal, e.g., copper or nickel.

The substrate 404 can be mounted to a lead frame 446, such as a metal lead frame (e.g., a copper lead frame). The lead frame 446 includes wire bond pads that are electrically coupled with respective contacts (e.g., bond pads) of the substrate 404, such as by using bond wires 448. For example, the bond wires 448 arc upwardly from respective bond pads and are fully encapsulated by the mold compound. In a further example, at least some of the bond wires 448 may arc upward at least about 30 micrometers (e.g., at least about 40 micrometers, at least about 50 micrometers or at least about 75 micrometers). The height of the tubular wall 424 from the surface can be greater than the arc distance of the wire bonds. Accordingly, the tubular wall 424 is configured to have a height that is sufficient to accommodate the complete encapsulation of the bond wires 448 within the molding material 450.

FIG. 5 shows another of a packaged sensor 500 mounted to a lead frame 546 having a protectively coated L-shaped tubular wall 524 formed (e.g., according to the method of FIGS. 1A through 1I) over a seed layer 504. The tubular wall 524 has a proximal portion 512 and a distal flange portion 522 (e.g., outwardly extending overhang) that extends radially outwardly from the proximal portion and a smaller or nonexistent inwardly extending overhang. The distal flange portion 522 of the tubular wall 524 functions as a stop for sideward inflow of the molding material that forms a mold 550, preventing the molding material from entering an opening of the sensing cavity 516 and coating the polymer and capacitive sensor elements (not shown), which are fabricated in the semiconductor (e.g., silicon) substrate 504 at a sensing area 552 at the bottom of the sensing cavity 516. The outer overhang of the distal flange portion 522 of the tubular wall serves to promote adhesion and prevent delamination of the mold 550 from the tubular wall. The tubular wall can be metal, e.g., copper. The tubular wall is protected from oxidation by a protective coating 532, e.g., electroless nickel or electroless tin. The semiconductor substrate 504 can be mounted to a lead frame 546, e.g., a metal lead frame, e.g., a copper lead frame. The lead frame 546 may be coupled to contacts (e.g., bond pads) of the substrate 504 using wire bonds 548 that arc upward and are fully encapsulated by the mold. Accordingly, the tubular wall is tall enough to accommodate the complete encapsulation of the bond wires 548.

Figure 6A:
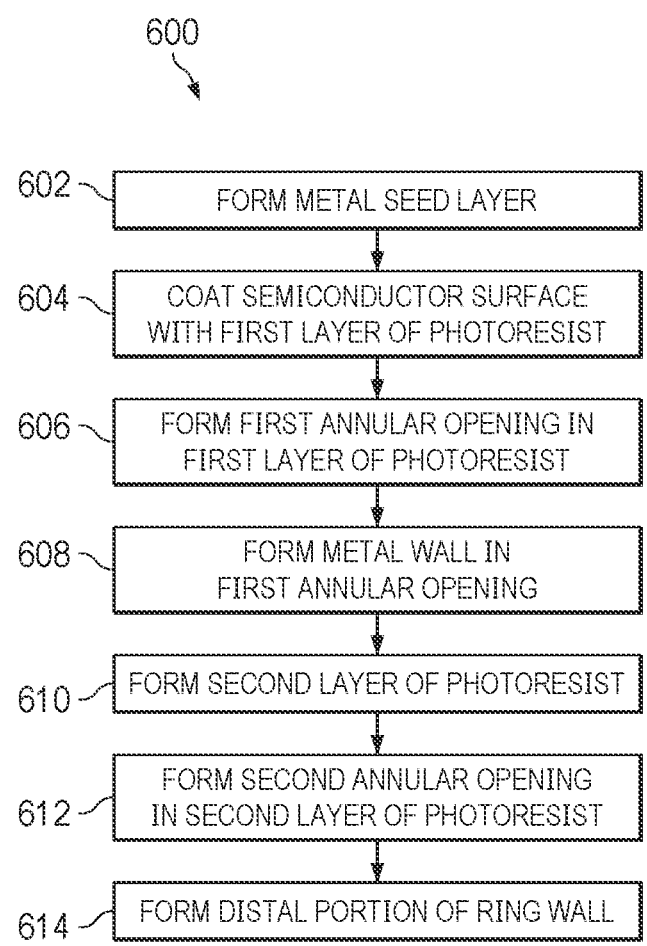
FIGS. 6A and 6B are flow charts showing example methods of forming a tubular wall for a humidity sensor.
Figure 6B:
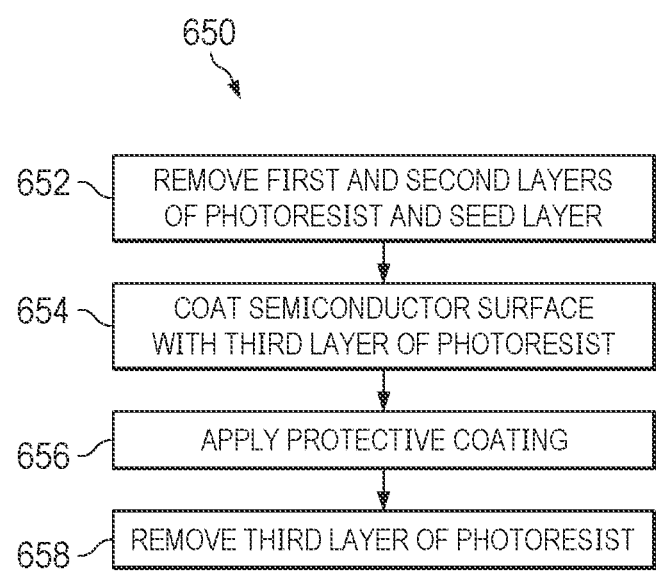

FIGS. 6A and 6B are flow diagrams showing an example method 600 of making a semiconductor device, and more specifically of forming a tubular wall for a humidity sensor. The method 600 can be used to implement the method of FIGS. 1A through 1I. Accordingly, the description of FIGS. 6A and 6B also refers to FIGS. 1A through 1I. At 602, the method 600 of FIG. 6A includes forming a metal seed layer on a semiconductor surface. The semiconductor surface can be an upper surface of a semiconductor substrate that can correspond, for example, to substrate 102 in FIG. 1A. The semiconductor can be silicon, such as a silicon die in which one or more sensor circuits, including humidity sensor circuitry, has been formed. For example, the semiconductor surface upon which the metal seed layer is formed at 602 can have capacitive elements, which have been fabricated on the semiconductor surface, and a sensing polymer formed over the capacitive elements. The metal seed layer can correspond, for example, to seed layer 104 in FIG. 1A, and can be formed, for example, using a titanium-tungsten/copper sputter deposition. At 604, the semiconductor surface is then coated with a first layer of photoresist to a first depth. At 606, a first annular trough is formed in the first layer of photoresist by exposing and developing the first layer of photoresist with a first mask. The first layer of photoresist and the first annular trough can respectively correspond, for example, to photoresist material 508 and annular opening 109 in FIG. 1B. The first depth can be, e.g., greater than about 90 micrometers. The first mask can be, for example, as shown in FIG. 2 or FIG. 3.

At 608, a metal annulus is formed in the first annular trough. The metal annulus can be formed by electroplating. For example, the metal annulus can be formed of copper or nickel. The metal annulus can correspond, for example, to tubular wall proximal portion 112 in FIG. 1C. At 610, the first layer of photoresist is then coated with a second layer of photoresist to a second depth. The second layer of photoresist can correspond, for example, to second photoresist material 118 in FIG. 1D. In some examples, the first photoresist is a negative resist and the second photoresist is a positive resist. At 612, a second annular trough is formed in the second layer of photoresist by exposing and developing the second layer of photoresist with a second mask. The second annual trough can correspond, for example, to second annular opening 119 in FIG. 1D. At 614, an upper rim of the annulus is formed in the second annular trough, the upper rim having an outer overhang and no inner overhang or an inner overhang of less than fifty percent of the outer overhang. The upper rim can correspond, for example, to tubular wall distal flange portion 122 of FIG. 1E.

The method 600 of FIG. 6A can, in some examples, continue with the method 650 of FIG. 6B, in which at 652, the first and layers of photoresist and the seed layer are removed. The removal at 652 provides a rimmed annulus, such as the tubular wall 112 shown in FIG. 1F. At 654, the semiconductor surface is coated with a third layer of photoresist after the removing the first and second layers of photoresist (at 652). However, the third layer of photoresist can be applied so as not to coat the annulus or the surface of the distal flange portion 122. The third layer of photoresist can correspond to third photoresist material 128 of FIG. 1G.

At 656, the surfaces of the tubular wall 124 (including proximal and distal portions 112 and 122) are coated with a protective layer of a corrosion resistant material. The protective layer can be coated 656, for example, by electroplating. For example, the protective coating is electroless nickel, electroless tin or other corrosion resistant material. The protective coating can correspond, for example, to protective coating 132 of FIG. 1H. At 658, the third layer of photoresist is then removed 658. The photoresist removal at 658 provides a protectively coated rimmed annulus that can correspond to respective surfaces of tubular wall 112, 122, 124 of FIG. 1I.

The two-pass photolithography method of FIGS. 1A through 1F and 6A and the three-pass photolithography method of FIGS. 1A through 1I and 6A and 6B produce an L-shaped tubular wall, as shown in FIGS. 1F and 1I, that retains the mold adhesion benefits of the outer overhang of existing overplated tubular wall designs, and that furthermore advantageously is resistant to trapping particles and residue within the sensing cavity. The two-pass photolithography and plating process flow has the further advantage that it does not require changes to existing fabrication equipment. Whereas a straight outer wall can cause delamination between the metal tubular wall and the mold, retention of a radially outwardly extending overhang in the distal flange portion of the tubular wall helps the mold material of the packaged sensor better attach to the metal surface of the tubular wall. The radially outwardly extending overhang in the L-shaped tubular wall thus helps prevent delamination. The sensors shown in FIGS. 4 and 5 thus preserve the radially outwardly extending overhang while eliminating an inner overhang found in many existing designs. The L-shaped tubular wall methods and devices described herein further can enable smaller die sizes. A nickel or tin coating provides added protection to the sensor as a highly corrosion-resistant material. Multiple tubular walls and sensors can be fabricated on a single silicon wafer and cut into multiple sensor dies.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A semiconductor device comprising:
a semiconductor die having a surface and sensing circuitry at a sensing region thereof the surface; and
a tubular wall of a metal material having an inner sidewall around the sensing region to provide a sensing cavity that extends from the surface of the semiconductor die to an opening at a distal edge thereof, the tubular wall including:
a proximal portion extending longitudinally from the surface; and
a distal flange portion extending radially outwardly from the proximal portion a first distance and radially inwardly from the proximal portion a second distance less than the first distance.

2. The semiconductor device of claim 1, wherein the second distance is substantially zero.

3. The semiconductor device of claim 1, wherein the first distance is at least ten percent of a height of the tubular wall.

4. The semiconductor device of claim 2, wherein the height of the tubular wall is greater than about 90 micrometers.

5. The semiconductor device of claim 1, wherein the metal material comprises copper.

6. The semiconductor device of claim 5, further comprising a coating of a corrosion resistant material over surfaces of the tubular wall.

7. The semiconductor device of claim 6, wherein the corrosion resistant material includes electroless nickel or electroless tin.

8. The semiconductor device of claim 1, wherein the inner sidewall has an inner diameter of less than about 75 micrometers as measured at the surface of the semiconductor die.

9. The semiconductor device of claim 1, further comprising:
a metal lead frame having a die pad and wire bond pads, in which the semiconductor die is attached to the die pad;
wire bonds coupled between respective wire bond pads and respective bond pads of the semiconductor die; and
molding material encapsulating a portion of the semiconductor device, the wire bonds, and a portion of the lead frame, and surfaces within the sensing cavity being free of the molding material.

10. The semiconductor device of claim 9, further comprising a coating of a corrosion resistant material over respective surfaces of the tubular wall, in which the molding material covers the coating on radially outer and inner surfaces of the tubular wall.

11. The semiconductor device of claim 1, wherein the sensing circuitry includes an arrangement of capacitors and a polymer configured as an humidity sensor.

12. A method of making a semiconductor device, the method comprising:
forming a seed layer over a surface of a semiconductor die;
forming a first annular trough patterned in a first photoresist layer on the seed layer;
forming a proximal portion of a tubular wall of a metal material in the first annular trough;
forming a second annular trough patterned in a second photoresist layer over the first photoresist layer and the proximal portion of the tubular wall; and
forming a distal flange portion of the tubular wall of the metal material in the second annular trough, in which the tubular wall has a radially inner sidewall around a sensing region on the surface of the semiconductor die and the distal flange portion extends radially outwardly from the proximal portion over the surface of the semiconductor die.

13. The method of claim 12, wherein the semiconductor die includes sensing circuitry formed in the semiconductor die at the surface thereof.

14. The method of claim 12, further comprising:
forming a third photoresist layer on over bond pads on the surface of the semiconductor die after the removing the first and second photoresist layers, at least the radially inner sidewall and distal end surfaces of the tubular wall being free of the third photoresist layer;
forming a protective layer over at least the radially inner sidewall and the distal end surface of the tubular wall; and
removing the third photoresist layer.

15. The method of claim 14, wherein after removing the third photoresist layer, the method further comprises
attaching the semiconductor die to a die pad of a lead frame;
coupling wire bonds coupled between respective bond pads on the lead frame and respective bond pads on the semiconductor die; and
encapsulating a portion of the semiconductor die, the wire bonds and a portion of the lead frame with a molding material, in which the inner sidewall of the tubular wall remains free of the molding material.

16. The method of claim 12, further comprising
attaching the semiconductor die to a die pad of a lead frame;
coupling wire bonds coupled between respective bond pads on the lead frame and respective bond pads on the semiconductor die; and
encapsulating a portion of the semiconductor die, the wire bonds and a portion of the lead frame with a molding material, in which the inner sidewall of the tubular wall remains free of the molding material.

17. The method of claim 12, wherein the first photoresist layer is a negative resist and the second photoresist layer is a positive resist.

18. A packaged semiconductor device, comprising:
a lead frame having a die pad;
a semiconductor die on the die pad, the semiconductor die including a humidity sensor, the humidity sensor including:
sensing circuitry at a sensing region of a surface of the semiconductor die; and
a metal tubular wall having a central sensing cavity extending through an inner sidewall thereof overlying the sensing region, the tubular wall having a proximal portion and a distal flange portion, in which the proximal portion extends longitudinally from the surface of the semiconductor die, and the distal flange portion extends radially outwardly from the proximal portion a first distance and radially inwardly from the proximal portion a second distance that is less than the first distance; and a molding material encapsulating a portion of the lead frame and a portion of the semiconductor die, including along a radially outer surface of the tubular wall, in which the sensing cavity and sensing region are free of the molding material.

19. The packaged semiconductor device of claim 18, wherein:

the proximal portion has a first inner diameter, a first outer diameter, and a first height; and the distal flange portion has a second inner diameter, a second outer diameter, and a second height, in which the second inner diameter is approximately equal to the first inner diameter, and the second outer diameter is larger than the first outer diameter.

20. The packaged semiconductor device of claim 19, wherein a sum of the first height and the second height is greater than 90 micrometers.

21. The packaged semiconductor device of claim 18, further comprising a protective coating on respective surfaces of the tubular wall.

22. The packaged semiconductor device of claim 18, further comprising:

wire bonds coupled between bond pads on the lead frame and the semiconductor die, the molding material wholly encapsulating the wire bonds.

* * * * *